US009933454B2

(12) United States Patent
Rogel-Favila et al.

(10) Patent No.: US 9,933,454 B2
(45) Date of Patent: Apr. 3, 2018

(54) UNIVERSAL TEST FLOOR SYSTEM (71) Applicant: Advantest Corporation, Tokyo (JP)

(72) Inventors: Ben Rogel-Favila, San Jose, CA (US); Roland Wolff, Santa Rosa, CA (US); Eric Kushnick, San Jose, CA (US); James Fishman, Dublin, CA (US); Mei-Mei Su, Mountain View, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 14/515,417

(22) Filed: Oct. 15, 2014

(65) Prior Publication Data

US 2015/0355229 A1 Dec. 10, 2015

Related U.S. Application Data (60) Provisional application No. 62/009,130, filed on Jun. 6, 2014.

(51) Int. Cl.
*G01R 31/00* (2006.01)
*G01R 1/04* (2006.01)
*G01R 31/26* (2014.01)
*G01R 31/28* (2006.01)
*G01R 1/44* (2006.01)
(Continued)

(52) U.S. Cl.
CPC ............. *G01R 1/04* (2013.01); *B25J 9/0084* (2013.01); *B25J 9/0093* (2013.01); *G01R 1/44* (2013.01); *G01R 31/26* (2013.01); *G01R 31/2801* (2013.01); *G01R 31/2851* (2013.01); *G01R 31/2893* (2013.01); *G11B 19/048* (2013.01)

(58) Field of Classification Search
CPC ............ G01R 31/2637; G01R 31/2801; G01R 31/2806; G01R 31/2808; G01R 31/281; G01R 31/2812; G01R 31/2834; G01R 31/2851; G01R 31/286; G01R 31/2863; G01R 31/2865; G01R 31/2867; G01R 31/2868; G01R 31/31905; G01R 31/31908; G01R 1/04; G01R 21/26
USPC ................ 324/73.1, 756.01, 756.02, 756.05, 324/757.01–757.05, 763
See application file for complete search history.

(56) References Cited

U.S. PATENT DOCUMENTS 4,038,599 A * 7/1977 Bove ................... G01R 1/07314
324/73.1
4,560,058 A * 12/1985 Enochs ................ B65G 47/082
198/426

(Continued)

*Primary Examiner* — Tung X Nguyen
*Assistant Examiner* — Sean Curtis (57) ABSTRACT In an embodiment, a universal test floor system includes a first robot that is configured to pack a plurality of universal test containers each including similar dimensions into a universal bin. Each universal test container is configured to enclose each of a plurality of different devices to test. The universal test floor system includes a universal conveyor configured to transport the universal bin. The first robot is configured to put the universal bin onto the universal conveyor and a second robot is configured to remove it. A universal test cell system is configured to receive the universal bin. The universal test cell system includes a plurality of test slots configured to receive a plurality of universal test containers. The universal test cell system is configured to test the plurality of different devices while each is located within one of the plurality of universal test containers.

20 Claims, 10 Drawing Sheets (51) Int. Cl.
*B25J 9/00* (2006.01)
*G11B 19/04* (2006.01)

(56) References Cited

U.S. PATENT DOCUMENTS

| | | | |
|---|---|---|---|
| 4,724,383 A | 2/1988 | Hart | |
| 4,774,462 A | 9/1988 | Black | |
| 4,777,434 A | 10/1988 | Miller et al. | |
| 4,782,291 A | 11/1988 | Blandin | |
| 4,888,549 A * | 12/1989 | Wilson | G01R 31/28 324/73.1 |
| 5,310,039 A * | 5/1994 | Butera | G01R 31/2851 198/346.2 |
| 5,329,227 A | 7/1994 | Sinclair | |
| 5,451,884 A | 9/1995 | Sauerland | |
| 5,555,422 A | 9/1996 | Nakano | |
| 5,625,287 A * | 4/1997 | Nakamura | B23Q 7/1447 324/750.19 |
| 5,633,598 A | 5/1997 | Van Loan et al. | |
| 5,788,084 A | 8/1998 | Onishi et al. | |
| 5,794,783 A | 8/1998 | Carter | |
| 5,847,293 A * | 12/1998 | Jones | G01R 31/2851 324/750.08 |
| 5,903,163 A * | 5/1999 | Tverdy | G01R 31/2849 324/750.08 |
| 5,914,585 A | 6/1999 | Grabon | |
| 5,914,858 A | 6/1999 | McKeen et al. | |
| 5,945,838 A | 8/1999 | Gallagher et al. | |
| 6,008,636 A * | 12/1999 | Miller | G01R 31/01 324/757.01 |
| 6,078,188 A | 6/2000 | Bannai et al. | |
| 6,137,303 A * | 10/2000 | Deckert | G01R 31/2831 324/757.03 |
| 6,194,908 B1 | 2/2001 | Wheel et al. | |
| 6,198,273 B1 | 3/2001 | Onishi et al. | |
| 6,204,679 B1 * | 3/2001 | Gray, III | G11C 29/56 324/750.08 |
| 6,339,321 B1 * | 1/2002 | Yamashita | G01R 31/01 324/750.14 |
| 6,354,792 B1 * | 3/2002 | Kobayashi | G01R 31/316 257/E23.179 |
| 6,392,433 B2 * | 5/2002 | Itasaka | G01R 1/0408 324/750.23 |
| 6,518,745 B2 | 2/2003 | Kim et al. | |
| 6,526,841 B1 | 3/2003 | Wanek et al. | |
| 6,583,638 B2 | 6/2003 | Costello et al. | |
| 6,679,128 B2 | 1/2004 | Wanek et al. | |
| 6,732,053 B1 * | 5/2004 | Aragona | G01R 31/2834 702/108 |
| 7,070,323 B2 | 7/2006 | Wanek et al. | |
| 7,091,737 B2 * | 8/2006 | Norris | G01R 31/2868 324/750.05 |
| 7,151,388 B2 * | 12/2006 | Gopal | G01R 31/2867 209/573 |
| 7,292,023 B2 | 11/2007 | Dangelo et al. | |
| 7,339,387 B2 * | 3/2008 | Dangelo | G01R 31/2863 324/750.05 |
| 7,532,023 B2 | 5/2009 | Norris | |
| 7,550,964 B2 | 6/2009 | Dangelo et al. | |
| 7,585,208 B2 | 9/2009 | Rosales Vizueta | |
| 7,612,575 B2 | 11/2009 | Ito et al. | |
| 7,729,107 B2 | 6/2010 | Atkins et al. | |
| 7,800,393 B2 | 9/2010 | Ito et al. | |
| 7,825,650 B2 | 11/2010 | Casterton et al. | |
| 7,884,631 B2 * | 2/2011 | Co | G11C 29/56 324/757.01 |
| 7,929,303 B1 * | 4/2011 | Merrow | G11B 33/128 324/73.1 |
| 7,960,992 B2 * | 6/2011 | Co | G11C 29/56 324/757.01 |
| 8,237,461 B2 | 8/2012 | Kitazume et al. | |
| 8,248,091 B2 * | 8/2012 | Cheng | G01R 1/07371 324/754.07 |
| 8,269,507 B2 | 9/2012 | Hall | |
| 8,628,235 B2 * | 1/2014 | Davies | G01M 99/002 374/109 |
| 9,110,129 B1 * | 8/2015 | Ames | G01R 31/2808 |
| 9,164,050 B2 * | 10/2015 | Davies | G01M 99/002 |
| 2001/0035058 A1 * | 11/2001 | Wanek | G01R 31/2849 73/865.6 |
| 2002/0011862 A1 | 1/2002 | Kvanvig et al. | |
| 2002/0053045 A1 * | 5/2002 | Gillenwater | G06F 11/2273 714/38.14 |
| 2002/0109518 A1 | 8/2002 | Saito et al. | |
| 2002/0130654 A1 | 9/2002 | Tauchi et al. | |
| 2002/0149389 A1 * | 10/2002 | Bjork | G01R 31/2893 324/750.05 |
| 2002/0175697 A1 | 11/2002 | Miller et al. | |
| 2003/0062888 A1 * | 4/2003 | Magliocco | G01R 31/31903 324/750.08 |
| 2003/0085160 A1 * | 5/2003 | Shim | G01R 31/2887 209/573 |
| 2003/0121337 A1 | 7/2003 | Wanek et al. | |
| 2003/0173950 A1 * | 9/2003 | Flach | G01R 31/2853 324/756.05 |
| 2004/0062104 A1 * | 4/2004 | Muller | G01R 31/2891 365/201 |
| 2004/0066207 A1 * | 4/2004 | Bottoms | G01R 31/2886 324/756.02 |
| 2004/0178808 A1 | 9/2004 | Fenk | |
| 2005/0225338 A1 * | 10/2005 | Sands | G11B 33/121 324/755.01 |
| 2006/0066293 A1 * | 3/2006 | Gopal | G01R 31/2867 324/750.14 |
| 2007/0063724 A1 * | 3/2007 | Roberts | G01R 31/2893 324/750.16 |
| 2008/0038098 A1 * | 2/2008 | Ito | G01R 31/2865 414/222.01 |
| 2008/0042667 A1 * | 2/2008 | Yamashita | G01R 31/2865 324/750.03 |
| 2008/0079456 A1 * | 4/2008 | Lee | G01R 31/2893 324/750.03 |
| 2008/0136439 A1 * | 6/2008 | Adam | G01R 31/2889 324/750.08 |
| 2008/0143129 A1 | 6/2008 | Wong et al. | |
| 2009/0195264 A1 * | 8/2009 | Tsen | G01R 31/2867 324/750.03 |
| 2009/0217093 A1 * | 8/2009 | Co | G01R 31/31723 714/30 |
| 2011/0012631 A1 * | 1/2011 | Merrow | G11B 33/128 324/750.03 |
| 2011/0012632 A1 * | 1/2011 | Merrow | G11B 5/4555 324/750.03 |
| 2011/0064546 A1 * | 3/2011 | Merrow | G11B 33/128 414/226.05 |
| 2011/0074458 A1 * | 3/2011 | Di Stefano | G01R 1/0466 324/757.01 |
| 2012/0068725 A1 | 3/2012 | Pagani | |
| 2012/0139572 A1 * | 6/2012 | Kim | G01R 31/2889 324/754.07 |
| 2012/0249177 A1 * | 10/2012 | Choi | G01R 31/2893 324/756.02 |
| 2012/0291999 A1 | 11/2012 | Lewinnek et al. | |
| 2013/0057310 A1 * | 3/2013 | Hasegawa | H01L 24/75 324/757.01 |
| 2013/0200913 A1 * | 8/2013 | Panagas | G01R 1/0441 324/756.02 |
| 2013/0200916 A1 * | 8/2013 | Panagas | G01R 1/0441 324/757.01 |
| 2013/0340977 A1 * | 12/2013 | Singleton | F28D 15/02 165/104.21 |
| 2013/0342989 A1 * | 12/2013 | Singleton | G06F 1/185 361/679.39 |
| 2013/0342993 A1 * | 12/2013 | Singleton | H05K 7/20836 361/690 |
| 2014/0015559 A1 * | 1/2014 | Lee | G01R 1/0466 324/756.02 |
| 2014/0184255 A1 * | 7/2014 | Johnson | G01R 31/2834 324/750.16 |

(56) References Cited

U.S. PATENT DOCUMENTS

| | | | |
|---|---|---|---|
| 2014/0218063 A1* | 8/2014 | Roberts, Jr. | G01R 31/2601 324/756.02 |
| 2014/0306728 A1* | 10/2014 | Arena | G01R 31/2808 324/750.08 |
| 2015/0028908 A1 | 1/2015 | Kushnick et al. | |
| 2015/0061713 A1* | 3/2015 | Shia | G01R 1/07371 324/750.16 |
| 2015/0233967 A1 | 8/2015 | Thordarson et al. | |
| 2015/0234006 A1* | 8/2015 | Richards | G01R 31/308 324/756.02 |
| 2015/0355229 A1* | 12/2015 | Rogel-Favila | G01R 31/26 324/756.02 |
| 2015/0355230 A1* | 12/2015 | Rogel-Favila | G01R 31/26 324/756.01 |
| 2015/0355231 A1* | 12/2015 | Rogel-Favila | G01R 31/26 324/750.13 |
| 2015/0355268 A1* | 12/2015 | Rogel-Favila | G01R 31/2893 324/750.08 |
| 2015/0355270 A1* | 12/2015 | Rogel-Favila | G01R 31/2874 324/750.08 |
| 2015/0355271 A1* | 12/2015 | Rogel-Favila | G01R 31/2867 324/750.08 |
| 2015/0355279 A1* | 12/2015 | Rogel-Favila | G01R 31/2893 324/750.25 |

\* cited by examiner

UNIVERSAL TEST FLOOR SYSTEM

CROSS-REFERENCE TO RELATED APPLICATIONS

This application claims the benefit of U.S. Provisional Patent Application No. 62/009,130, filed Jun. 6, 2014, by Rogel-Favila et al., which is hereby incorporated by reference. In addition, the following U.S. patent applications are hereby incorporated by reference: U.S. patent application Ser. No. 14/515,421, concurrently filed on Oct. 15, 2014, entitled "Universal Container for Device Under Test," by Rogel-Favila et al., and U.S. patent application Ser. No. 14/515,422, concurrently filed on Oct. 15, 2014, entitled "Universal Test Cell," by Rogel-Favila et al.

BACKGROUND

Conventionally, a manufacturing company or business may have many different product lines. For example, the manufacturing company may produce devices like a semiconductor chip and a solid state drive (SSD) which is much bigger and physically very different from a semiconductor chip. Typically, each time a new product is developed, a test platform is developed by the manufacturing company that can include tester interface electronics, carrier devices, and robots capable of handling and testing each device under test (DUT). As a result, the manufacturing company can eventually have many different product lines and many different test platforms, which are burdensome to maintain and manage.

SUMMARY

Various embodiments in accordance with the invention can address the disadvantages described above by providing a single test platform that is able to test a wide variety of components in an automated way regardless of the physical and electrical interfaces characteristics of the DUT.

In an embodiment, a universal test floor system includes a first robot configured to pack a plurality of universal test containers each including similar dimensions into a universal bin. Each universal test container is configured to enclose each of a plurality of different devices to test. Each universal test container includes an external electrical interface configured to couple to each of the plurality of different devices to test. Furthermore, the universal test floor system includes a universal conveyor configured to transport the universal bin. The first robot is configured to put the universal bin onto the universal conveyor. In addition, the universal test floor system includes a second robot configured to remove the universal bin from the universal conveyor. Moreover, the universal test floor system includes a universal test cell system configured to receive the universal bin. The universal test cell system includes a plurality of test slots configured to receive a plurality of universal test containers. The universal test cell system is configured to test the plurality of different devices while each is located within a universal test container of the plurality of universal test containers. The universal test cell system includes a plurality of universal electrical interfaces that are each configured to couple with the external electrical interface of each universal test container.

In another embodiment, a method includes packing via a first robot a plurality of universal test containers each including similar dimensions into a universal bin. Each universal test container is configured to enclose each of a plurality of different devices to test. Each universal test container includes an external electrical interface configured to couple to each of the plurality of different devices to test. The method also includes transporting the universal bin via a universal conveyor to a universal test cell system configured to receive the universal bin. The universal test cell system includes a plurality of test slots configured to receive a plurality of universal test containers. In addition, the method includes testing via the universal test cell system the plurality of different devices while each is located within a universal test container of the plurality of universal test containers. The universal test cell system includes a plurality of universal electrical interfaces that are each configured to couple with the external electrical interface of each universal test container.

In yet another embodiment, a universal test floor system includes a first robot configured to pack a plurality of universal test containers each including similar dimensions into a universal bin. Each universal test container is configured to enclose each of a plurality of different devices to test. Each universal test container includes an external electrical interface configured to couple to each of the plurality of different devices to test. Additionally, the universal test floor system includes a universal conveyor configured to transport the universal bin. The first robot is configured to put the universal bin onto the universal conveyor. Furthermore, the universal test floor system includes a second robot configured to remove the universal bin from the universal conveyor and a universal test cell system configured to receive the universal bin. The universal test cell system includes a plurality of test slots configured to receive a plurality of universal test containers. The universal test cell system is configured to test the plurality of different devices at the same time while each is located within a universal test container of the plurality of universal test containers. The universal test cell system includes a plurality of universal electrical interfaces that are each configured to couple with the external electrical interface of each universal test container.

While particular embodiments in accordance with the invention have been specifically described within this Summary, it is noted that the invention and the claimed subject matter are not limited in any way by these embodiments.

BRIEF DESCRIPTION OF THE DRAWINGS

Within the accompanying drawings, various embodiments in accordance with the invention are illustrated by way of example and not by way of limitation. It is noted that like reference numerals denote similar elements throughout the drawings.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

The figures are not drawn to scale, and only portions of the structures, may be shown in the figures. Furthermore, fabrication processes and steps may be performed along with the processes and steps discussed herein; that is, there may be a number of process steps before, in between and/or after the steps shown and described herein.

Figure 1:
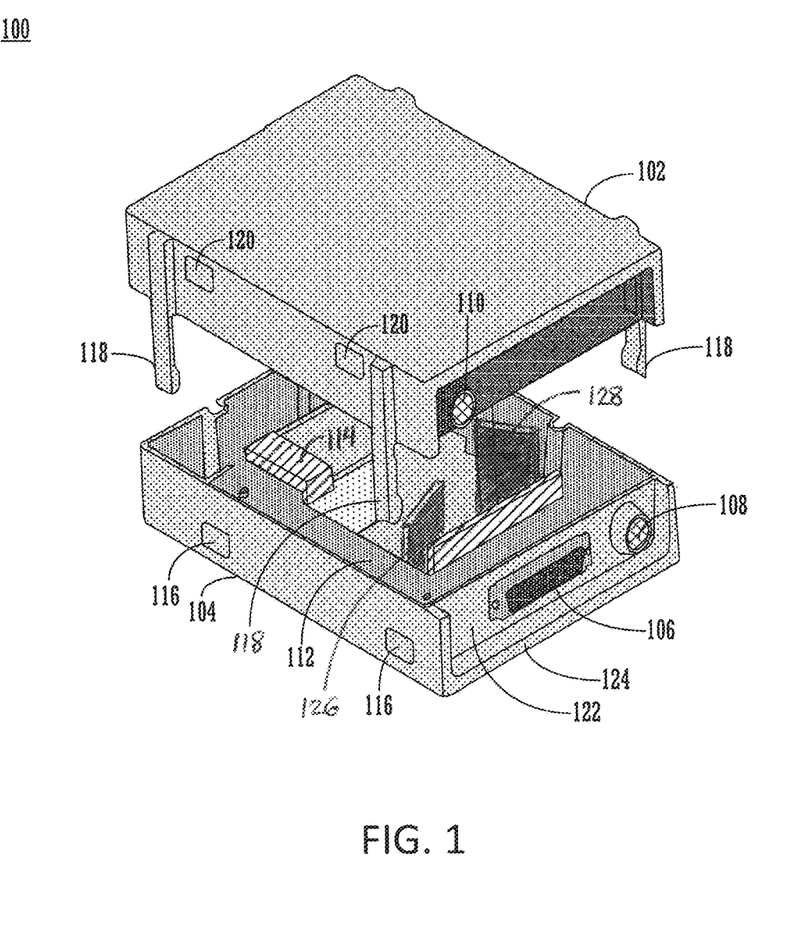
FIG. 1 is a perspective view of a universal test container (or carrier) in accordance with various embodiments of the invention.

FIG. 1 is a perspective view of a universal test container (or carrier) 100 in accordance with various embodiments of the invention. In order to handle very different physical devices under test (DUT) in an automated system, various embodiments of the invention give automated robots a common physical interface, wherein they are only handling and working with universal test boxes 100 that are the same or of similar size. A universal exterior electrical interface 106 of the test box 100 interfaces with a test head of a universal test cell (e.g., 602) and an interior electrical interface 114 interfaces with the DUT (not shown in FIG. 1) which is changeable. Note that in an embodiment, the interior interface 114 is changeable. In an embodiment, the internal interface 114 can be customized to mate with and communicate with the DUT or DUTs inside the test box 100. It is pointed out that in an embodiment, the interior interface/frame 112 within the test box 110 can be removed and changed depending on the DUT being tested, but the outer dimensions of the test box 100 and interface location and interface definition are fixed. That is, everything within the test box 100 is changeable depending on the testing needs while the exterior dimensions of the test box 100 remain the same or similar. Now with the same dimensions of the test box 100, the same test system is able to be used for all the test boxes 100, the same information systems, and the same handling mechanisms. This gives flexibility in testing very physically dissimilar components with the same test system by using the same mechanical interface.

In an embodiment, the universal test container or box or "test box" 100 can include an external universal electrical interface 106 and the test box 100 can have a universal size and shape. For example, if there is a larger component like a solid state drive (SSD) or a hard disk drive (HDD) to test, maybe one of them can fit within the universal test box 100. However, if there is a semiconductor chip to test, a circuit board could be developed that can include multiple semiconductor chips and then that circuit board can be installed into an internal interface 114 of the test box 100. In this way, a common external electrical interface 106 is provided to the automated system while the semiconductor chips or the SSD are tested by the system.

Within FIG. 1, the universal test container (test box) 100 can be implemented with a uniform form factor and interface 106. The universal external interface 106 can be translated to a custom internal interface 114 for mating with a device under test (DUT) using a removable electrical/mechanical interface 112 housed largely within the test box 100. In an embodiment, one or more internal interfaces 114 of the test box 100 can be customized to mate with and communicate with the DUT or DUTs located inside the test box 100. Note that in various embodiments, very small components, such as, semiconductor chips and larger components, such as, solid-state devices (SSD) or hard disk drives (HDD) can be installed as DUTs within the test box 100. With smaller items, more than one component can be placed within the test box 100. In this manner, a test platform only needs to handle, move, install and uninstall the same or similar size test box 100 with a universal electrical interface 106 within an entire test system thereby simplifying that entire test system.

In various embodiments, within the test box 100, the interface/frame 12 can be referred to as an electro-mechanical interface 112 with one side that has a universal exterior electrical interface 106 and the other side that is the internal interface 114. Note that in one embodiment, the universal exterior electrical interface 106 is located in the same or similar outside position of each test box 100. In an embodiment, it can be desirable to minimize the distance between the interior electrical interface 114 and the universal exterior electrical interface 106 to improve high speed electrical signals. In addition, in an embodiment, each half of the test box 100 can be implemented with an airflow hole one (e.g., 110) for thermal air coming into the test box 100 and the other hole (e.g., 108) for thermal air going out of the test box 100 in order to control the temperature inside the test box 100. A test cell (e.g., 602) can have a blower along with a heating system and/or a cooling system for providing temperature controlled air flow (e.g., cooled or heated air) to the test box 100. The universal test box 100 enables regulation of temperature within it. A temperature sensor (not shown) can be implemented near the thermal air input (e.g., 110) of the test box. In another embodiment, the DUT may include a temperature sensor and that can be used to determine the temperature of the DUT and to regulate the temperature within the test box 100. In an embodiment, a temperature sensor can be put in a circuit board that includes one of more DUTs. Internal to the test box 100, it may include one or more baffles 126 for directing airflow and/or to secure the one or more DUTs within the test box 100.

Within FIG. 1, in various embodiments, the outside of the test box 100 can be fabricated in such a way that it is easier to be handled by robotic grippers. The cover 102 can include one or more recessed areas (not shown) that enable the cover to be removed or installed with a base 104 of the test box 100. As previously mentioned, there can also be one or more baffles 126 included within the test box 100 in order to specifically direct the flow of thermal air that may enter and exit the test box 100. In other words, the inside of the test box 100 can be designed so that the air flows where desired. In various embodiments, one or more changeable baffles 128 can be implemented within the test box 100 which can be changed or modified to implement different air flow configurations within the test box 100.

In one embodiment, the universal exterior electrical interface 106 of the test box 100 can be located within a recessed area 122 thereby enabling the protruding edges 124 of the test box 100 to act as a guide when the test box 100 is inserted into a test cell (e.g., 602). Other types of guides such as pins can be implemented as part of the outside surface of the test box 100 to help align the insertion of the test box 100 into a test cell. In various embodiments, the size and shape of the test box 100 can be determined based on the largest component or device to be tested. Note that one or more interior surfaces of the test box can include guides to keep the one or more components or devices to be tested in place. In one embodiment, the test box 100 could be a box with a lid similar to lid 102 that is attached or hinged to the test box 100. In various embodiments, the shape of the test box 100 can be implemented as any shape, the concept is the same: having the same size and shaped container for housing one or more DUTs while the container has a common external electrical/mechanical interface (e.g., 106). It is noted that the common electrical/mechanical interface (e.g., 106) can be located on any one or more surfaces of the test box 100.

Within FIG. 1, the universal test box 100 can include a lid portion or top cover 102 that includes a thermal air inlet 110, one or more recesses 120, and one or more clips 118 that protrude from the lid 102. In addition, the universal test box 100 can include a base portion 104 that includes a thermal air output or outlet 108, the interior interface/frame 112, the interior electrical interface 114, the universal exterior electrical interface 106, and one or more recesses 116. In various embodiments, it is noted that one or more clips 118 of the lid 102 of the test box 100 can latch or couple with one or more recesses 116 of the base 104 of the test box 100.

It is noted that the universal test box 100 may not include all of the elements illustrated by FIG. 1. In addition, the universal test box 100 can be implemented to include one or more elements not illustrated by FIG. 1. It is pointed out that the universal test box 100 can be utilized or implemented in any manner similar to that described herein, but is not limited to such.

Figure 2:
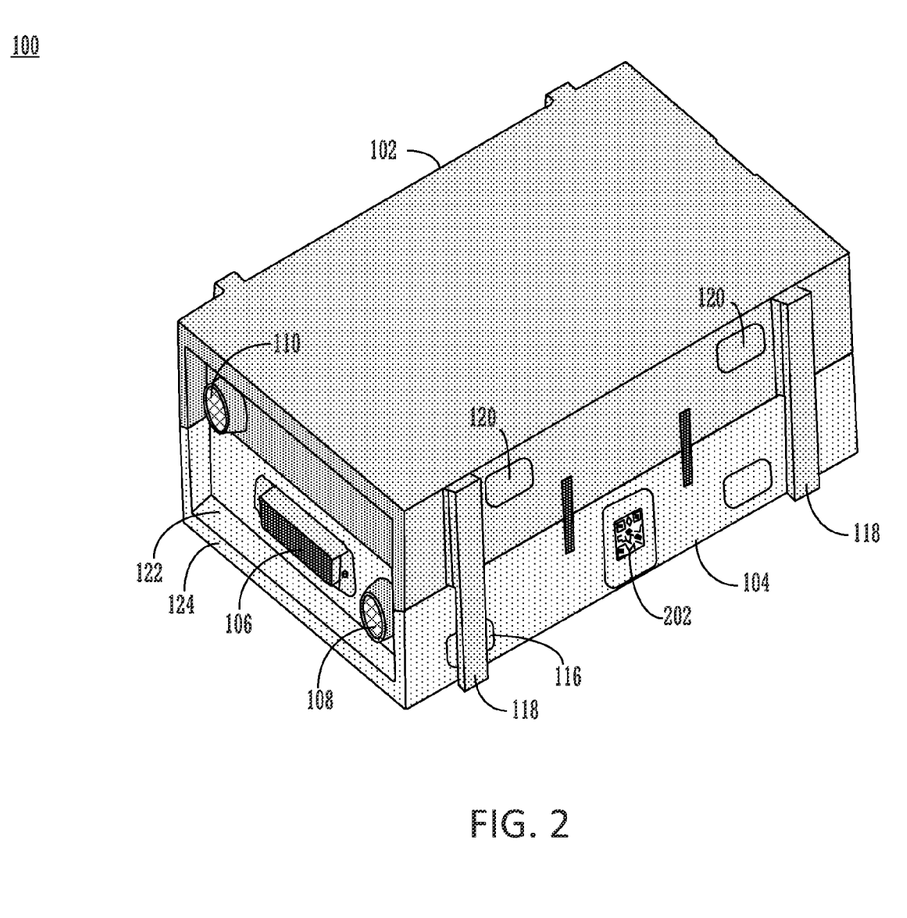
FIG. 2 is another perspective view of a universal test container in accordance with various embodiments of the invention.

FIG. 2 is a perspective view of a universal test container 100 in accordance with various embodiments of the invention. Specifically, FIG. 2 illustrates the cover 102 of the universal test box 100 coupled or attached to the base 104 of the universal test box 100. In the present embodiment, it is pointed out that at least one of the clips 118 of the lid 102 is aligned with at least one of the recesses 116 of the base 104 of the test box 100. In an embodiment, as shown in FIG. 2, the base 104 can include an identification (ID) tag 202 that can be used to track the usage of the base 104 (e.g., to track how often it has been used). Note that in an embodiment, the ID tag 202 can uniquely identify the base 104 that it is attached to. The ID tag 202 can be implemented as, but is not limited to, a barcode, a linear barcode, a matrix barcode, and the like.

Figure 3:
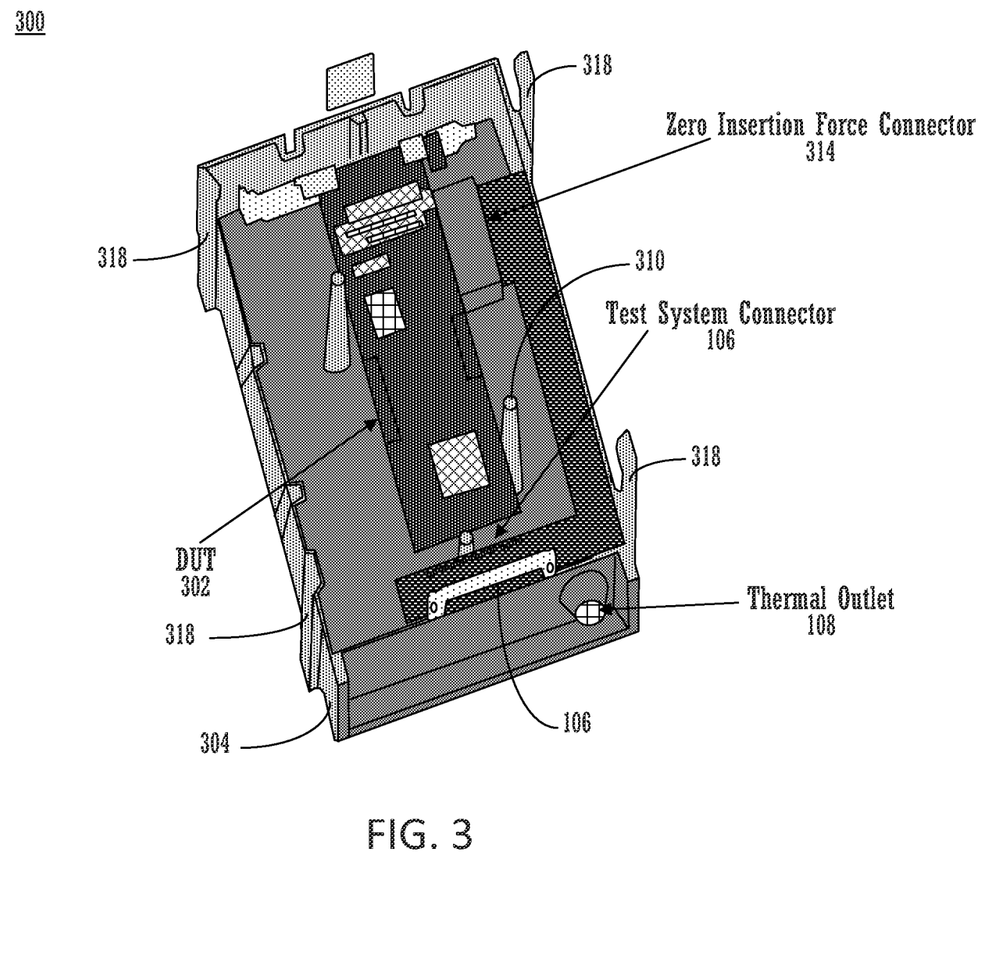
FIG. 3 is yet another perspective view of a universal test container in accordance with various embodiments of the invention.

FIG. 3 is a perspective view of a base portion 304 of a universal test container 300 in accordance with various embodiments of the invention. It is pointed out that the universal test container 300 and its base portion 304 are similar in functionality to the universal test container 100 and its base portion 104, described herein. However, note that in an embodiment, the base portion 304 can include one or more clips 318 that protrude from the base 304. It is understood that the one or more clips 318 can operate in a manner similar to the one or more clips 118 of the test box 100, but are not limited to such. It is noted that within the present embodiment, the interior electrical interface 314 of the universal test container 300 can be implemented as a zero insertion force connector, but is not limited to such. In the present embodiment, the base 304 of the test box 300 includes an installed device under test (DUT) 302 which is coupled to the interior electrical interface 314. The base portion 304 also can include one or more posts 310 which can secure or stabilize or restrict the movement of the installed DUT 302.

Note that the universal test box 300 may not include all of the elements illustrated by FIG. 3. In addition, the universal test box 300 can be implemented to include one or more elements not illustrated by FIG. 3. It is pointed out that the universal test box 300 can be utilized or implemented in any manner similar to that described herein, but is not limited to such.

Figure 4:
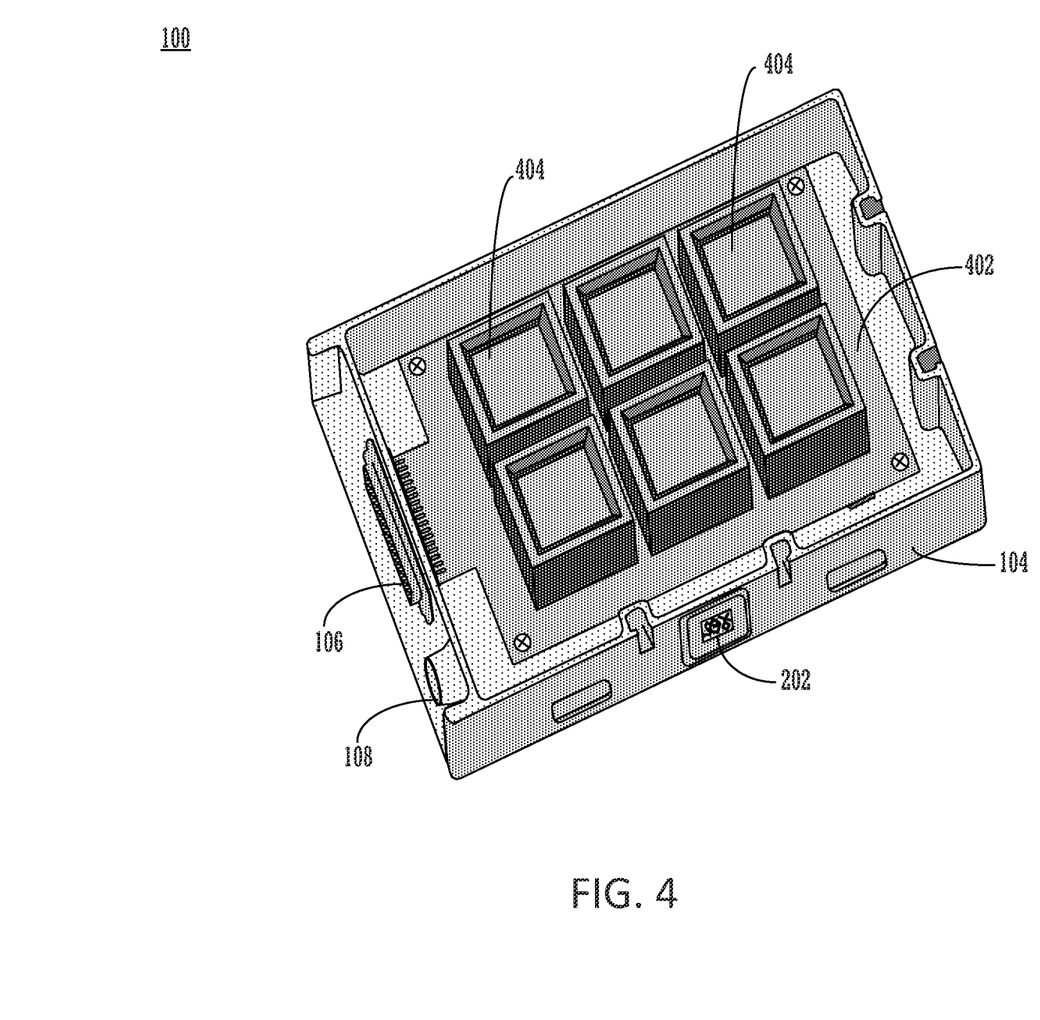
FIG. 4 is still another perspective view of a universal test container in accordance with various embodiments of the invention.

FIG. 4 is a perspective view of the universal test container 100 in accordance with various embodiments of the invention. Specifically, in the present embodiment, FIG. 4 illustrates the base portion 104 of the universal test box 100 including multiple DUTs 404 coupled or installed onto a printed circuit board (PCB) 402, which is coupled to the universal exterior electrical interface 106. In this manner, the multiple DUTs 404 can be transported and tested by a test cell system (e.g., 600) while contained within the universal test box 100.

Figure 5:
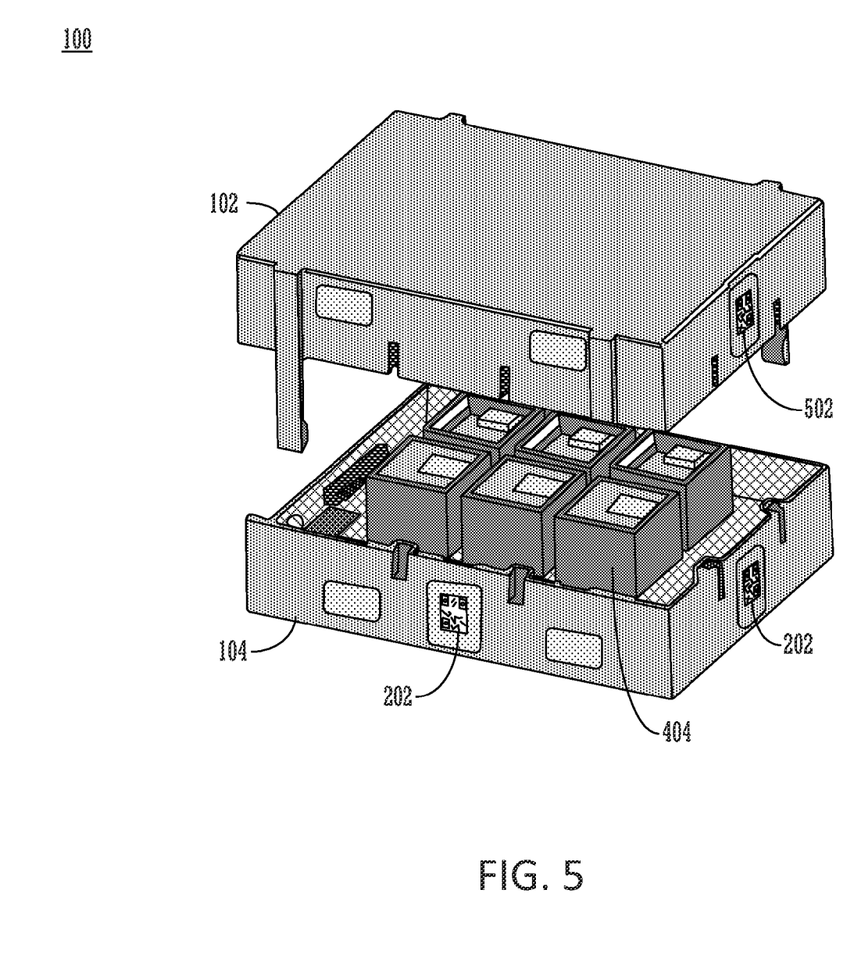
FIG. 5 is another perspective view of a universal test container in accordance with various embodiments of the invention.

FIG. 5 is another perspective view of the universal test container 100 in accordance with various embodiments of the invention. Specifically, in the present embodiment, FIG. 5 illustrates the cover or lid portion 102 of the universal test box 100 in combination with the base portion 104 illustrated in FIG. 4. It is pointed out that the cover 102 can be implemented with an identification (ID) tag 502 which can be utilized to track the usage of the cover 102 (e.g., to track how often it has been used). In an embodiment, as shown in FIG. 5, the base 104 includes multiple identification tags 202 that are each located on a different surface of the base 104, but are not limited to such. Note that in an embodiment, the cover 102 can also be implemented with multiple identification tags 502 which may each be located on a different surface of the cover 102, but are not limited to such. Note that in an embodiment, the identification tags 202 and 502 can uniquely identify the base 104 and the cover 102, respectively, that each is attached to. The ID tag 502 can be implemented as, but is not limited to, a barcode, a linear barcode, a matrix barcode, and the like.

Figure 6:
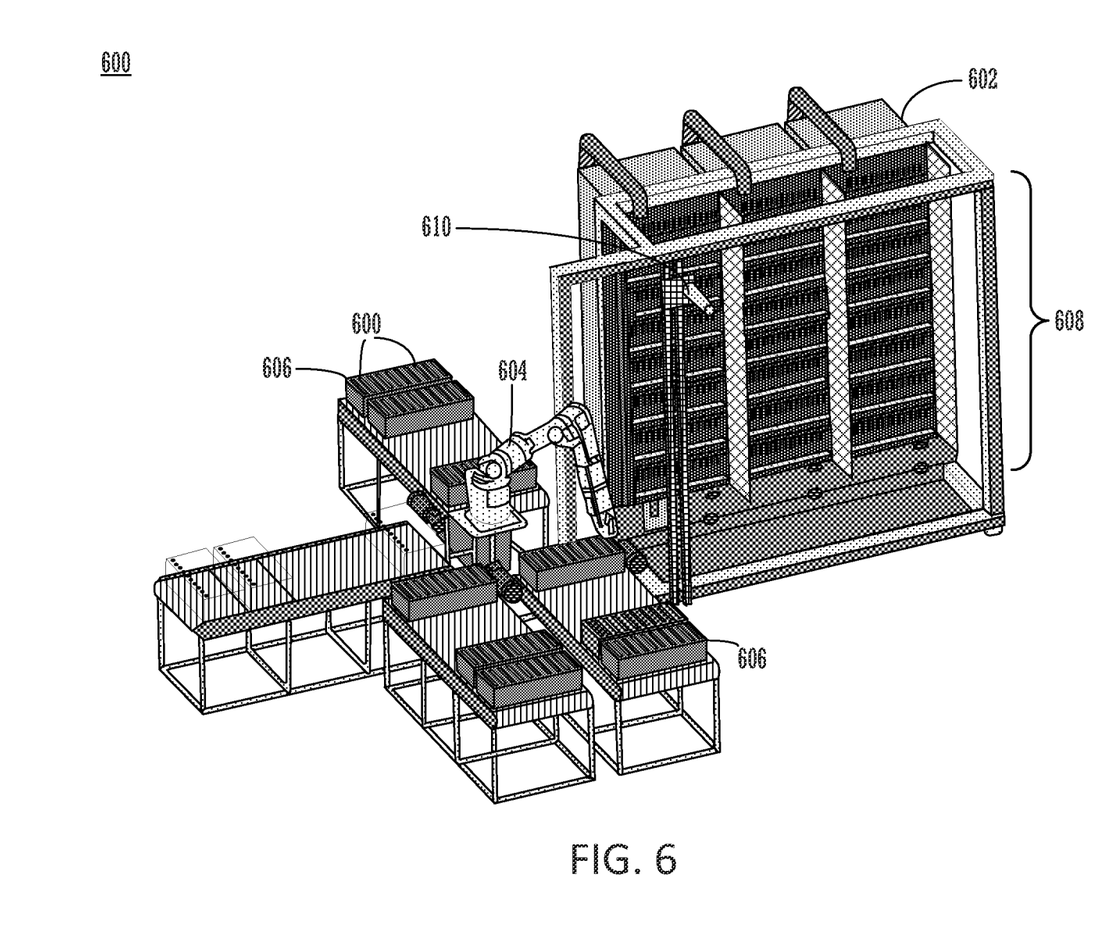
FIG. 6 is a perspective view of a universal test cell system in accordance with various embodiments of the invention.

FIG. 6 is a perspective view of a universal test cell system 600 in accordance with various embodiments of the invention. The universal test cell system 600 is adapted to operate with one or more universal test containers (e.g., 100 or 300). In the present embodiment, the universal test cell system 600 can include a universal test cell 602, one or more bins 606 that can hold or contain one or more universal test containers, and one or more robots 604. Note that in an embodiment, the one or more robots 604 are for handling the test boxes 100 to and from the universal test cell 602.

In the present embodiment, the universal test cell 602 can be utilized to test many universal test boxes 100 at the same time. The universal test cell 602 can be implemented with one or more universal electrical interfaces or connections (not shown) that are each designed to mate or couple with the external electrical interface or connection 106 of each of the test boxes 100. Furthermore, universal adaptors (not shown) exist within each mating location of the universal test cell 602 for providing air flow and other temperature regulation mechanisms for each attached test box 100. By using a universal test box 100, a universal test cell 602 can be produced for testing one or more DUTs regardless of their electrical interface and physical dimensions.

Within FIG. 6, in various embodiments, the universal test cell 602 can be utilized in combination with the test box described herein. In this manner, the universal test cell 602 can be standardized or made universal since it will be implemented to handle and work with universal test boxes 100 that have the same or similar shape and size. In an embodiment, the universal test cell 602 can include a wall of test slots 608 that includes automation for mechanical, electrical, and thermal control in order to test each component (or DUT) located within the one or more test boxes 100. The universal test cell 602 can be the integration of the automation, thermal, electronics, and software so that it can test one or more components inside the one or more test boxes 100. The universal test cell 602 can include one or more robots 610 for installing and uninstalling test boxes with the universal test cell 602. Note that by using the test boxes 100, the test cells 602 can all include similar grippers, similar interfaces, and similar input compartments.

In an embodiment, a universal test cell 602 can be adapted with a robot 610 for testing one or more DUTs located within a universal test box 100. Note that in an embodiment, the robotics for the test cell 602 can also be standardized since it is working with the same or similar size and shape test box 100 along with the same or similar size conveyor system (not shown). In addition, the programming for the robots can be simplified since they are working with the same or similar size and shape test box 100. In this manner, the test cell system 600 only needs to handle, move, install and uninstall the same or similar size test box 100 with a universal electrical interface 106 within the entire test system 600, thereby simplifying that entire system 600. The test cell 602 can be universal in that it is implemented to handle and work with test boxes 100 having the same or similar shape and size. In this manner, the test cell 602 can increase throughput because it does not involve different physical sizes of devices under test (DUT).

It is pointed out that the universal test cell system 600 may not include all of the elements illustrated by FIG. 6. For example, in various embodiments, the universal test cell system 600 may be configured for operation without the robots 604 and 610 in a laboratory or office environment or other setting. Additionally, the universal test cell system 600 can be implemented to include one or more elements not illustrated by FIG. 6. It is noted that the universal test cell system 600 can be utilized or implemented in any manner similar to that described herein, but is not limited to such.

Figure 7:
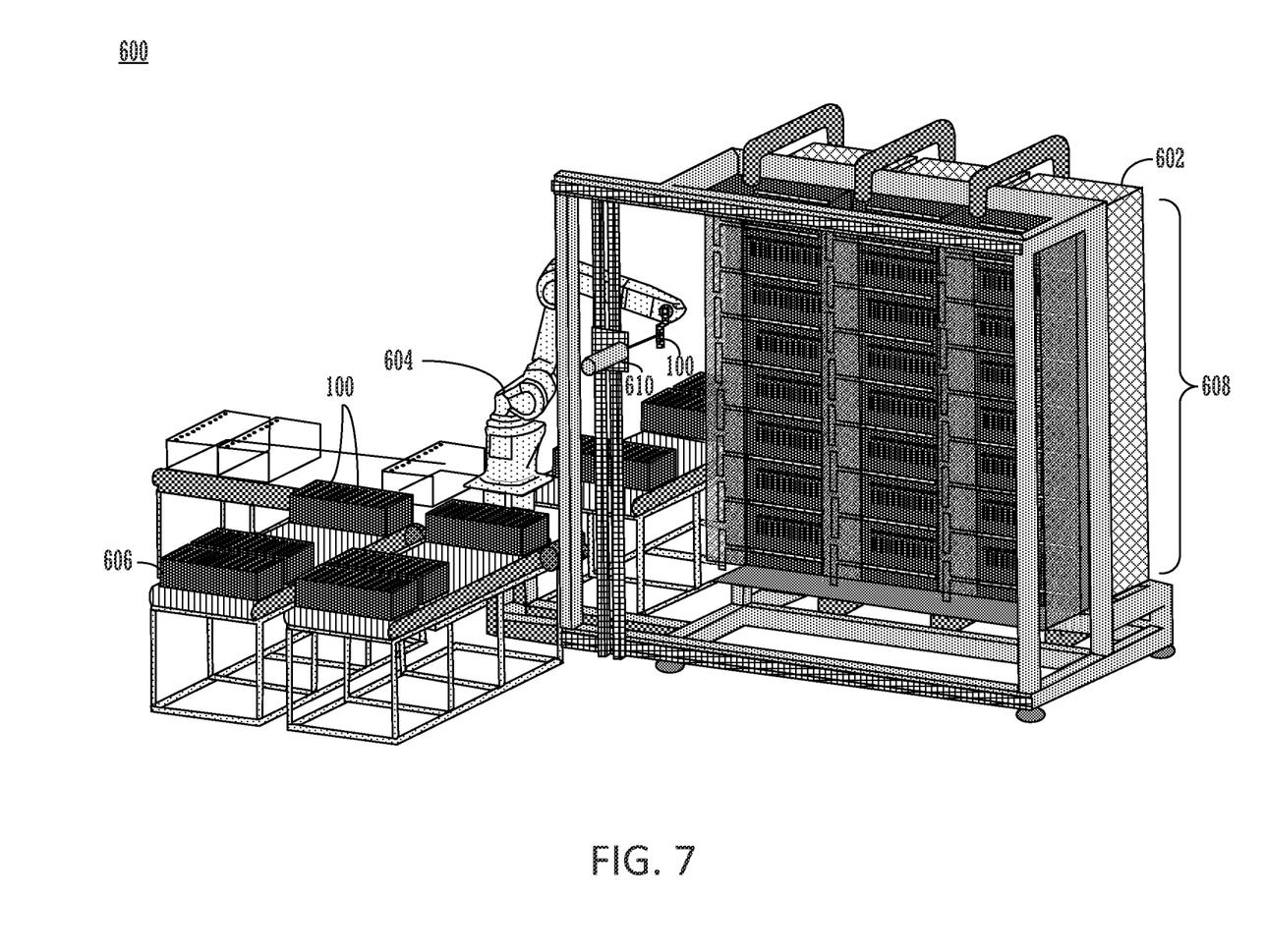
FIG. 7 is another perspective view of a universal test cell system in accordance with various embodiments of the invention.

FIG. 7 is another perspective view of the universal test cell system 600 in accordance with various embodiments of the invention. Specifically, the present embodiment illustrates the manner in which a hand over of a universal test container (e.g., 100 or 300) can occur between the robot 604 and the robot 610 of the universal test cell 602. In an embodiment, the robot 604 can remove a universal test container 100 (containing one or more DUTs) from a bin 606. Then the robot 604 can move so that it can hand over or give the test container 100 to the robot 610 of the universal test cell 602. The robot 610 can accept or take the test container 100 from the robot 604 and then proceed to install the test container 100 into one of the test slots 608 of the universal test cell 602.

Figure 8:
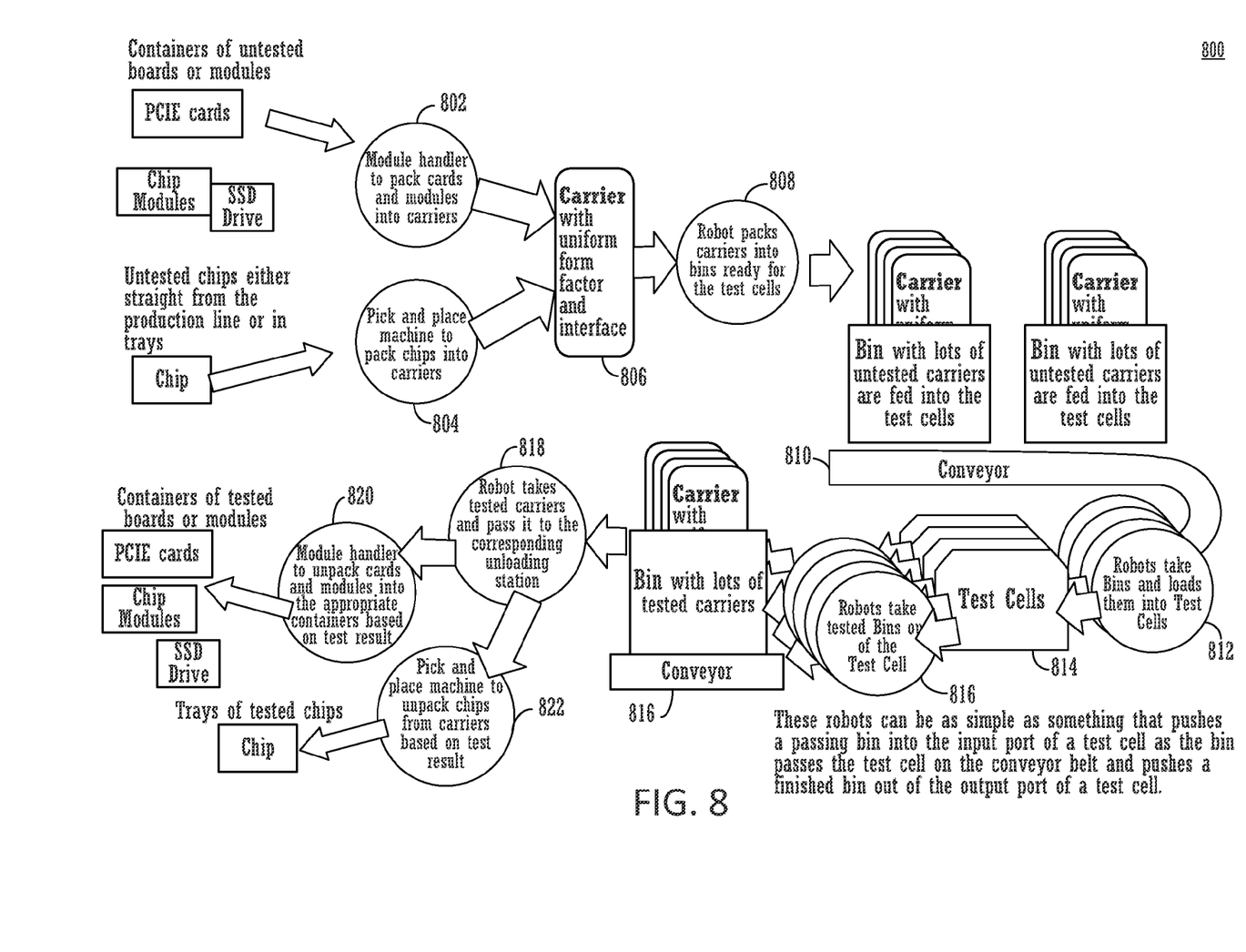
FIG. 8 is a flow diagram of a universal test floor system in accordance with various embodiments of the invention.

FIG. 8 is a flow diagram of a universal test floor system 800 in accordance with various embodiments of the invention. The universal test floor system 800 is adapted to operate with one or more universal test containers (e.g., 100 or 300) along with one or more universal test cell systems (e.g., 600). In this manner, all the benefits of the universal test container (e.g., 100 or 300) and the universal test cell systems (e.g., 600) are included within the universal test floor system 800. In various embodiments, the universal test floor system 800 can include bins (e.g., 606) to move multiple test boxes (e.g., 100 and/or 300), conveyer mechanisms to move bins from station to station, test cells (e.g., 602) and robot devices (e.g., 604 and/or 610). Note that in an embodiment, the robot devices move bins from conveyer to conveyer, and move test boxes 100 from bins to the test cell 602. By using the test box 100, all of the components of the universal test floor system 800 can be standardized to accept a standard or uniform test box 100, regardless of the physical nature of the DUT or the electrical connection interface of the DUT. Note that in an embodiment, the universal test floor system 800 can be automated.

At operation 802, a module handler (or robot) can pack or install one or more untested boards, devices, cards, components, and/or modules into one or more universal test containers (e.g., 100 or 300), which are referred to as carriers in FIG. 8. It is pointed out that the one or more untested boards, devices, cards, components, and/or modules can include, but are not limited to, semiconductor chip modules, SSD, HDD, and/or PCIE (Peripheral Component Interconnect Express) cards. At operation 804, a pick and place machine (or robot) can pack or install one or more untested semiconductor chips into one or more universal test containers (e.g., 100 or 300), which are referred to as carriers in FIG. 8. Note that the universal test containers (e.g., 100 or 300) provide thermal insulation, provide common electrical connection to test systems, provide common mechanical form factor to the automation equipment, and have uniform form factor and interface as noted at 806.

At operation 808 of FIG. 8, one or more robots pack the one or more universal test carriers (e.g., 100 or 300) into one or more uniform form factor bins (e.g., 606) that will be transported to one or more universal test cells (e.g., 602). At operation 810, the one or more bins are then distributed to test cells 602 by, for example, one or more conveyor belts. For example, the robot can then put the one or more bins onto one or more conveyor belts for transportation to one or more universal test cells 602. It is noted that this transportation within the universal test floor system 800 is also universal because the bins 606 are universal or standard and contain uniform test boxes 100. As such, the group or lot or set of test carriers 100 in a bin 606 travel as a set to each test cell 602.

At operation 812, one or more robots take the bins and load them into one or more universal test cells 602. In an embodiment, the one or more robots can push a passing bin into the input port of a universal test cell 602 as the bin passes the test cell on a conveyor. Once in the input port, a robot of the test cell can remove the one or more test carriers from the one or more bins and install them into test slots of the universal test cell. Alternatively, at operation 812, one or more robots can remove the bins from a conveyor and into a universal test cell system 600. At that point, the one or more test carriers 100 can be removed by a robot (e.g., 604)

and handed over to a robot (e.g., 610) of the universal test cell to be installed into one of its test slots 608. The universal test cell then tests the one or more DUTs located within each universal test box.

At operation 814 of FIG. 8, after the one or more DUTs contained within the one or more universal test carriers have been tested by the one or more universal test cells 602, the one or more robots of the one or more universal test cells 602 can uninstall the one or more universal test carriers and place them into one or more uniform bins. In various embodiments, the uniform bins may be located in an output port of the universal test cell or in a universal test cell system 600. At operation 816, one or more robots can move the bins containing the one or more universal test carriers of one or more tested DUTs out of the universal test cell and onto a conveyor. In an embodiment, the one or more robots can push a finished bin out of the output port of a universal test cell 602 and onto a conveyor. Alternatively, at operation 816, one or more robots can move the bins containing the one or more universal test carriers of one or more tested DUTs out of the universal test cell system 600 and onto a conveyor.

At operation 818, one or more robots take the tested universal carriers (e.g., 100 and/or 300) from the conveyor and pass them to the corresponding unloading station. At operation 820, a module handler (or robot) can unpack or uninstall the tested boards, devices, cards, components, and/or modules from the universal test carriers into the appropriate containers based on their test results. At operation 822, a pick and place machine (or robot) can unpack tested semiconductor chips from the universal test carriers into the appropriate containers or trays based on their test results.

Since the universal test floor system 800 is adapted to operate with one or more universal test containers (e.g., 100 or 300) along with one or more universal test cell systems (e.g., 600), the universal test floor system 800 just needs to handle, move, install and uninstall the same size universal test box (e.g., 100 and/or 300) with a universal electrical interface within the entire test system thereby simplifying that entire system 800. In addition, in order to handle very different physical devices under test (DUTs) in an automated system (e.g., 800), various embodiments of the invention give automated robots a common interface, wherein they are only handling and working with test boxes (e.g., 100 and/or 300) that are the same size with common grip points, interface locations, etc. Therefore, in an embodiment, the robotics for the universal test floor system 800 can be standardized since it is working with the same or similar size and shape universal test boxes (e.g., 100 and/or 300) along with the same or similar size conveyor system. In addition, the programming for the robots of the universal test floor system 800 can be simplified since they are working with the same or similar size and shape universal test boxes.

It is pointed out that the universal test floor system 800 may not include all of the elements illustrated by FIG. 8. Additionally, the universal test floor system 800 can be implemented to include one or more elements not illustrated by FIG. 8. It is noted that the universal test floor system 800 can be utilized or implemented in any manner similar to that described herein, but is not limited to such. For example, in various embodiments, a smaller number of universal test cells may be configured for operation either with or without robots in a laboratory or office environment or other setting.

Figure 9:
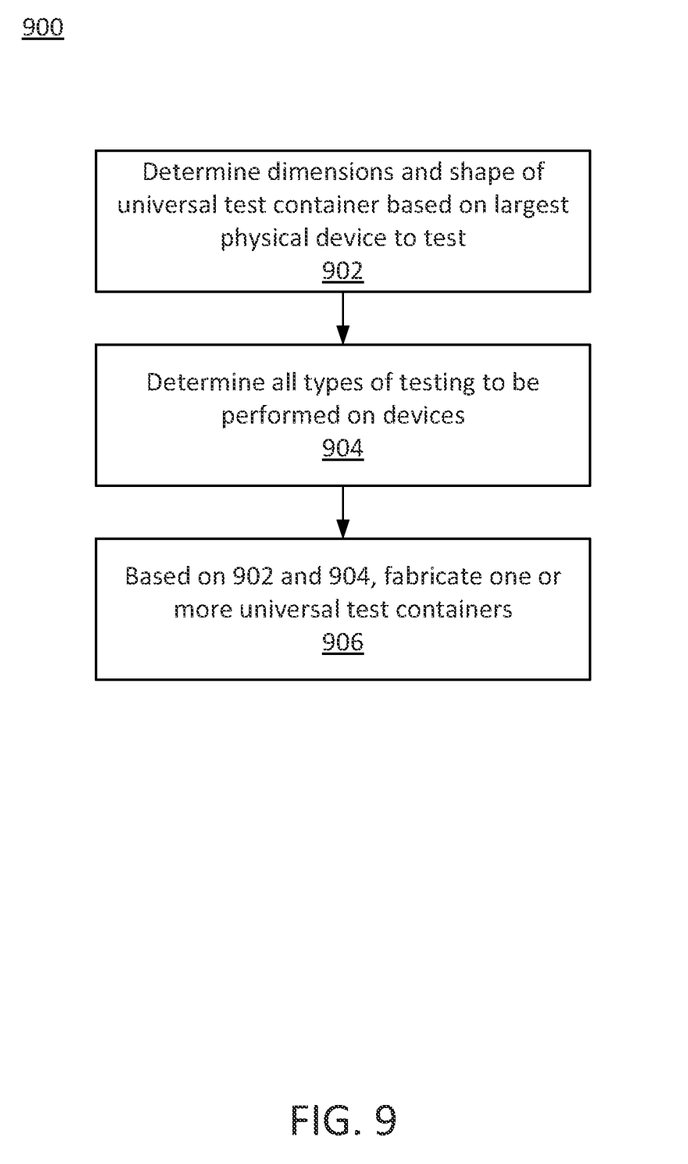
FIG. 9 is a flow diagram of a method in accordance with various embodiments of the invention.

FIG. 9 is a flow diagram of a method 900 for fabricating one or more universal test containers (e.g., 100 and/or 300) in accordance with various embodiments of the invention. Although specific operations are disclosed in FIG. 9, such operations are examples. The method 900 may not include all of the operations illustrated by FIG. 9. Also, method 900 may include various other operations and/or variations of the operations shown. Likewise, the sequence of the operations of flow diagram 900 can be modified. It is appreciated that not all of the operations in flow diagram 900 may be performed. In various embodiments, one or more of the operations of method 900 can be controlled or managed by software, by firmware, by hardware or by any combination thereof, but is not limited to such. Method 900 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

At operation 902 of FIG. 9, based on the largest physical device that is desired to be tested, a determination can be made as to the dimensions and shape of a universal test container (e.g., 100 or 300) that will completely contain or enclose that desired device. It is noted that operation 902 can be implemented in a wide variety of ways. For example, operation 902 can be implemented in any manner similar to that described herein, but is not limited to such.

At operation 904, a determination can be made as to all the types of testing (e.g., electrical, mechanical, software, and/or thermal) that will be performed on the one or more different devices that will be installed within the universal test container. Note that operation 904 can be implemented in a wide variety of ways. For example, operation 904 can be implemented in any manner similar to that described herein, but is not limited to such.

Figure 10:
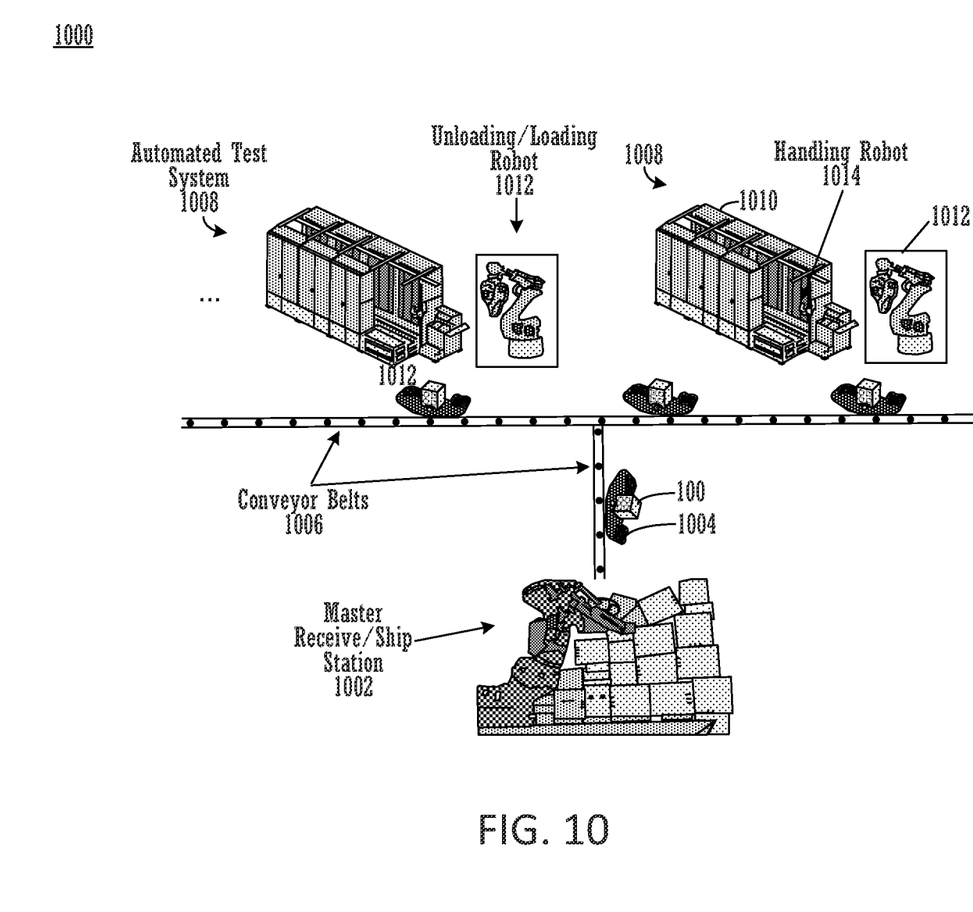
FIG. 10 is a diagram of a system in accordance with various embodiments of the invention.

At operation 906 of FIG. 9, based on the information determined at operations 902 and 904, one or more universal test containers (e.g., 100 and/or 300) can be fabricated with one or more desired materials. It is pointed out that operation 906 can be implemented in a wide variety of ways. For example, in various embodiments, the one or more universal test containers can be fabricated at operation 906 with, but not limited to, one or more plastics, carbon fiber, one or more metals, an alloy, and the like. Operation 906 can be implemented in any manner similar to that described herein, but is not limited to such. Therefore, method 900 enables fabrication of one or more universal test containers (e.g., 100 and/or 300) in accordance with various embodiments of the invention FIG. 10 is a diagram of an automated test floor system 1000 in accordance with various embodiments of the invention. The automated test floor system 1000 is adapted to operate and function in a manner similar to that described with reference to the universal test floor system 800 (FIG. 8), but is not limited to such.

The automated test floor system 1000 can include a master receive/ship station 1002 which can be automated with one or more robots that can take devices and/or components to be tested from boxes, containers, and/or trays and puts them into one or more universal test containers (e.g., 100 and/or 300). Furthermore, the master receive/ship station 1002 can load one or more universal test containers 100 into one or more universal bins 1004. The one or more universal bins 1004 can then be put onto conveyor belt 1006 by the master receive/ship station 1002. In this manner, the master receive/ship station 1002 is able to perform operations 802, 804, 808, and 810 of the universal test floor system 800.

Within FIG. 10, the automated test floor system 1000 can include one or more automated universal test cell systems 1008, each including a universal test cell 1010 and an unloading/loading robot 1012. It is noted that the conveyor belts 1006 can deliver the one or more universal bins 1004 to one or more automated universal test cell systems 1008. Each unloading/loading robot 1012 can remove the bins 1004 from the conveyor belts 1006 and put them into a receiving area of its corresponding universal test cell 1010. A handling robot 1014 of each universal test cell 1010 can pick up a universal test box 100 and insert or install it into one of many test slots of the automated universal test cell 1010. The automated universal test cell 1010 is then able to perform any number of automated tests on the one or more devices under test contained with the test container 100. In this manner, each automated universal test cell system 1008 is able to perform operation 812 of the universal test floor system 800. In addition, in various embodiments, it is pointed out that the combination of an automated universal test cell system 1008, the conveyor belts 1006, and the master receive/ship station 1002 can also perform operations 814, 816, 818, 820, and 822 of the universal test floor system 800.

In various embodiments, it is noted that the universal test container 300 can be substituted for any universal test container 100 described with reference to FIGS. 6, 7, 8, 9, and 10.

In various embodiments, it is pointed out that any robot or robots mentioned herein can be substituted with any type of automation capable of performing the desired one or more functions.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A universal test floor system comprising:
a first robot packs a plurality of universal test containers each comprising similar dimensions into a universal bin, each universal test container encloses each of a plurality of different devices to test, each universal test container comprises an external electrical interface that couples to each of said plurality of different devices to test, each universal test container internally comprises a baffle for directing airflow, each universal test container comprises a recessed area comprising said external electrical interface;
a universal conveyor transports said universal bin, said first robot configured to put said universal bin onto said universal conveyor;
a second robot removes said universal bin from said universal conveyor; and
a universal test cell system receives said universal bin, said universal test cell system comprising a plurality of test slots that receive a plurality of universal test containers, said universal test cell system tests said plurality of different devices while each is located within a universal test container of said plurality of universal test containers, said universal test cell system comprises a plurality of universal electrical interfaces that each couples with said external electrical interface of each universal test container, said recessed area comprises edges that act as a guide when each universal test container is inserted into said universal test cell system.

2. The universal test floor system of claim 1, wherein said universal test cell system comprises a robot that installs and uninstalls said plurality of universal test containers with said plurality of test slots.

3. The universal test floor system of claim 2, wherein said robot of said universal test cell system places said plurality of universal test containers into a universal bin after a device of said plurality of different devices has been tested.

4. The universal test floor system of claim 3, further comprising:
a third robot moves said universal bin onto said universal conveyor after said device of said plurality of different devices has been tested.

5. The universal test floor system of claim 1, further comprising:
a third robot installs each of said plurality of different devices into a universal test container of said plurality of universal test containers.

6. The universal test floor system of claim 1, further comprising:
a third robot uninstalls each of said plurality of different devices from a universal test container of said plurality of universal test containers.

7. The universal test floor system of claim 1, wherein each of said plurality of universal test containers comprises an air inlet and an air outlet.

8. The universal test floor system of claim 1, wherein one of said plurality of different devices to test comprises a semiconductor chip.

9. The universal test floor system of claim 1, wherein one of said plurality of different devices to test comprises a hard disk drive.

10. The universal test floor system of claim 1, wherein one of said plurality of different devices to test comprises a solid state drive.

11. A method comprising:
packing via a first robot a plurality of universal test containers each comprising similar dimensions into a universal bin, each universal test container encloses each of a plurality of different devices to test, each universal test container comprises an external electrical interface that couples to each of said plurality of different devices to test, each universal test container internally comprises a baffle for directing airflow, each universal test container comprises a recessed area comprising said external electrical interface;
transporting said universal bin via a universal conveyor to a universal test cell system that receives said universal bin, said universal test cell system comprising a plurality of test slots that receive a plurality of universal test containers;
testing via said universal test cell system said plurality of different devices while each is located within a universal test container of said plurality of universal test containers, said universal test cell system comprises a plurality of universal electrical interfaces that each couples with said external electrical interface of each universal test container, said recessed area comprises edges that act as a guide when each universal test container is inserted into said universal test cell system.

12. The method of claim 11, further comprising:
installing via a robot of said universal test cell system of said plurality of universal test containers into said plurality of test slots.

13. The method of claim 11, further comprising:
placing via a robot of said universal test cell system of said plurality of universal test containers into a universal bin after a device of said plurality of different devices has been tested.

14. The method of claim 13, further comprising:
installing via a second robot a device of said plurality of different devices into a universal test container of said plurality of universal test containers.

15. The method of claim 13, further comprising:
uninstalling via a second robot a device of said plurality of different devices from a universal test container of said plurality of universal test containers.

16. The method of claim 11, wherein each of said plurality of universal test containers comprises an air inlet and an air outlet.

17. The method of claim 11, wherein one of said plurality of different devices to test comprises a semiconductor chip.

18. A universal test floor system comprising:
a first robot packs a plurality of universal test containers each comprising similar dimensions into a universal bin, each universal test container encloses each of a plurality of different devices to test, each universal test container comprises an external electrical interface that couples to each of said plurality of different devices to test, each universal test container internally comprises a baffle that directs air flow, each universal test container comprises a recessed area comprising said external electrical interface;
a universal conveyor transports said universal bin, said first robot configured to put said universal bin onto said universal conveyor;
a second robot removes said universal bin from said universal conveyor; and
a universal test cell system receives said universal bin, said universal test cell system comprising a plurality of test slots that receive a plurality of universal test containers, said universal test cell system tests said plurality of different devices at the same time while each is located within a universal test container of said plurality of universal test containers, said universal test cell system comprises a plurality of universal electrical interfaces that each couples with said external electrical interface of each universal test container, said recessed area comprises edges that act as a guide when each universal test container is inserted into said universal test cell system.

19. The universal test floor system of claim 18, wherein said universal test cell system comprises a robot that installs and uninstalls said plurality of universal test containers with said plurality of test slots.

20. The universal test floor system of claim 18, further comprising:
a third robot installs each of said plurality of different devices into a universal test container of said plurality of universal test containers.

\* \* \* \* \*